(12) United States Patent
Cai et al.

(10) Patent No.: US 12,438,008 B2
(45) Date of Patent: Oct. 7, 2025

(54) METHOD OF PRODUCING ASSEMBLY OF STACKED ELEMENTS HAVING RESIN LAYER WITH FILLERS

(71) Applicant: TDK Corporation, Tokyo (JP)

(72) Inventors: Yongfu Cai, Tokyo (JP); Shuhei Miyazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/743,313

(22) Filed: Jun. 14, 2024

(65) Prior Publication Data

US 2024/0332103 A1  Oct. 3, 2024

Related U.S. Application Data

(63) Continuation of application No. 17/696,253, filed on Mar. 16, 2022, now Pat. No. 12,046,524, which is a
(Continued)

(30) Foreign Application Priority Data

Mar. 8, 2019  (JP) ................. 2019-042832

(51) Int. Cl.
*H01L 21/56*  (2006.01)
*H01L 23/00*  (2006.01)
*H01L 23/29*  (2006.01)

(52) U.S. Cl.
CPC ............ *H01L 21/56* (2013.01); *H01L 23/295* (2013.01); *H01L 24/19* (2013.01); *H01L 24/20* (2013.01); *H01L 24/92* (2013.01)

(58) Field of Classification Search
CPC ..... H01L 21/563; H01L 21/56; H01L 21/561; H01L 23/295
See application file for complete search history.

(56) References Cited

U.S. PATENT DOCUMENTS

| | | |
|---|---|---|
| 10,211,161 B2 | 2/2019 | Chiang et al. |
| 10,361,122 B1 | 7/2019 | Hsieh et al. |
| (Continued) | | |

FOREIGN PATENT DOCUMENTS

| | | |
|---|---|---|
| JP | 2007149905 A | 6/2007 |
| JP | 2013187231 A | 9/2013 |
| JP | 2014-056924 A | 3/2014 |

*Primary Examiner* — Dale E Page
*Assistant Examiner* — Abbigale A Boyle
(74) *Attorney, Agent, or Firm* — Posz Law Group, PLC

(57) ABSTRACT

In an assembly in which a space between two elements is filled with a filler containing resin, a configuration that can limit both the size of the assembly and the cost of the fillers is provided. An assembly of stacked elements has: first element having first surface; resin layer that is arranged on first surface and that contains a plurality of fillers; and second element that is arranged on resin layer and that has second surface that is in contact with resin layer. In a section that is perpendicular to second surface, the average flattening ratio of fillers that are in contact with second surface is larger than the average flattening ratio of fillers that are not in contact with second surface. Here, the flattening ratio is a ratio of the maximum length of the filler in a direction parallel to second surface to the maximum thickness of the filler in a direction perpendicular to second surface.

18 Claims, 8 Drawing Sheets

Related U.S. Application Data continuation of application No. 16/685,141, filed on Nov. 15, 2019, now Pat. No. 11,322,418.

(56) References Cited

U.S. PATENT DOCUMENTS

| | | |
|---|---|---|
| 11,171,080 B2 | 11/2021 | Kiso et al. |
| 2013/0082368 A1 | 4/2013 | Kim et al. |
| 2018/0061767 A1 | 3/2018 | Chiang et al. |
| 2019/0148250 A1* | 5/2019 | Yu .......................... H01L 21/56 257/773 |
| 2020/0020634 A1* | 1/2020 | Tsai ........................ H01L 24/19 |
| 2020/0126897 A1* | 4/2020 | Kiso ..................... H01L 23/295 |
| 2020/0381325 A1 | 12/2020 | Huang et al. |
| 2021/0057298 A1 | 2/2021 | Tsai et al. |

\* cited by examiner

METHOD OF PRODUCING ASSEMBLY OF STACKED ELEMENTS HAVING RESIN LAYER WITH FILLERS

CROSS REFERENCE TO RELATED APPLICATIONS

The present application is a continuation application of U.S. Utility application Ser. No. 17/696,253 filed on Mar. 16, 2022, which is a continuation application of U.S. Utility application Ser. No. 16/685,141 filed on Nov. 15, 2019, now U.S. Pat. No. 11,322,418 issued on May 3, 2022, which is based on, and claims priority from, Japanese application no. 2019-042832, filed on Mar. 8, 2019, the disclosures of which are hereby incorporated by reference.

BACKGROUND OF THE INVENTION

Field of the Invention

The present invention relates to an assembly of stacked elements and a sensor package, as well as methods of manufacturing these, particularly to the configuration of fillers of a sealing resin.

Description of the Related Art

Conventionally, a package is known in which an electric component, such as a sensor unit, is connected to another electric component and in which these components are entirely sealed with resin. Such a package is used to connect many external connection terminals to an electric component of a small size. A package in which external connection terminals protrude beyond the electric component is also called a fan-out package.

A filler containing resin is used as the resin. A filler containing resin is resin, such as epoxy resin, mixed with fillers that are made of inorganic material, such as silica. In general, resin has a high coefficient of thermal expansion when it cures, and the resin that has cured causes large stress, which may in turns functionally affect the electric component. Due to a low coefficient of thermal expansion of fillers, as compared to resin, the coefficient of thermal expansion of a filler containing resin is lower than that of resin that does not contain fillers, and the above-mentioned problem is less likely to occur.

In order to limit the size of a package, it is preferable that a connection between electric components be as compact as possible. For example, when two electric components are connected via an extraction electrode, a gap having the same dimension as the thickness of the extraction electrode may be formed between the two electric components. The gap is also filled with resin. However, since it is preferable that the gap be as small as possible, fillers having small diameters are used for the filler containing resin. JP2014-56924 discloses resin that contains filler whose maximum diameter is 5 μm.

SUMMARY OF THE INVENTION

The cost of fillers is correlated to the diameter of the fillers, and, in general, the cost of fillers having small diameters is high. Accordingly, when a small gap is filled with a filler containing resin, the cost of the fillers may increase. If the gap is large, then the cost of the fillers can be limited because the large gap can accommodate fillers having large diameters, but it is difficult to limit the size of a package. This problem occurs when a gap between electric components is filled with a filler containing resin, but also generally occurs when a space between two elements is filled with a filler containing resin.

The present invention relates to an assembly in which a space between two elements is filled with a filler containing resin and aims at providing a configuration that can limit both the size of the assembly and the cost of the fillers, as well as a method of manufacturing such an assembly.

An assembly of stacked elements according to the invention comprises: a first element having a first surface; a resin layer that is arranged on the first surface and that contains a plurality of fillers; and a second element that is arranged on the resin layer and that has a second surface that is in contact with the resin layer. In a section that is perpendicular to the second surface, an average flattening ratio of the fillers that are in contact with the second surface is larger than an average flattening ratio of the fillers that are not in contact with the second surface. Here, the flattening ratio is a ratio of a maximum length of the filler in a direction parallel to the second surface to a maximum thickness of the filler in a direction perpendicular to the second surface.

A method of manufacturing an assembly of stacked elements according to the invention comprises: a first element forming step to form a first element having a first surface; a resin layer forming step to form a resin layer on the first surface, wherein the resin layer contains a plurality of fillers; a grinding step to grind an upper surface of the resin layer; and a second element forming step to form a second element on the upper surface of the resin layer that has been ground, wherein the second element has a second surface that is in contact with the upper surface. Before the grinding step and after the resin layer forming step, a diameter of at least one of the fillers that are contained in the resin layer is larger than a gap between the first surface and the second surface.

According to the present invention, it is possible to provide a configuration that can limit both the size of the assembly and the cost of the fillers, as well as a method of manufacturing such an assembly.

The above and other objects, features and advantages of the present invention will become apparent from the following description with reference to the accompanying drawings which illustrate examples of the present invention.

DETAILED DESCRIPTION OF THE EMBODIMENTS

Figure 1A:
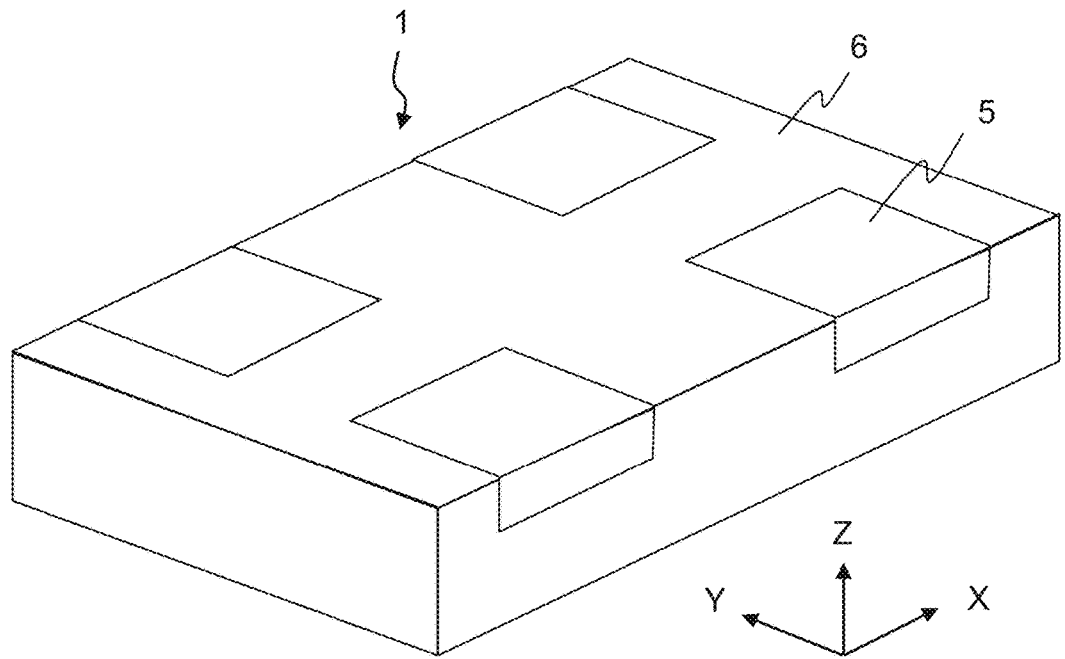
FIGS. 1A and 1B are perspective views of a fan-out package.

An embodiment of the present invention will be described with reference to the drawings. The present embodiment relates to a fan-out sensor package in which a sensor unit is connected to external connection terminals via redistribution layers. However, the present invention is not limited to such a sensor package, and may be applied to any assembly of stacked elements having a first element; a filler containing resin layer that is arranged on the first element; and a second element that is arranged on the first resin layer. In the following descriptions, the direction parallel to second surfaces 41 of redistribution layers 4 and in which redistribution layers 4 extend is referred to as X direction, the direction parallel to second surfaces 41 of redistribution layers 4 and perpendicular to X direction is referred to as Y direction, and the direction perpendicular to X and Y directions and perpendicular to second surfaces 41 of redistribution layers 4 are referred to as Z direction. A section perpendicular to second surface 41 means an arbitrary section that is parallel to Z direction. It should be noted that there are numerous numbers of sections that are perpendicular to second surface 41 and that such a section is not limited to the X-Z plane shown in the drawing. Similarly, there are numerous numbers of directions parallel to second surface 41, and such a direction is not limited to X and Y directions.

Figure 1B:
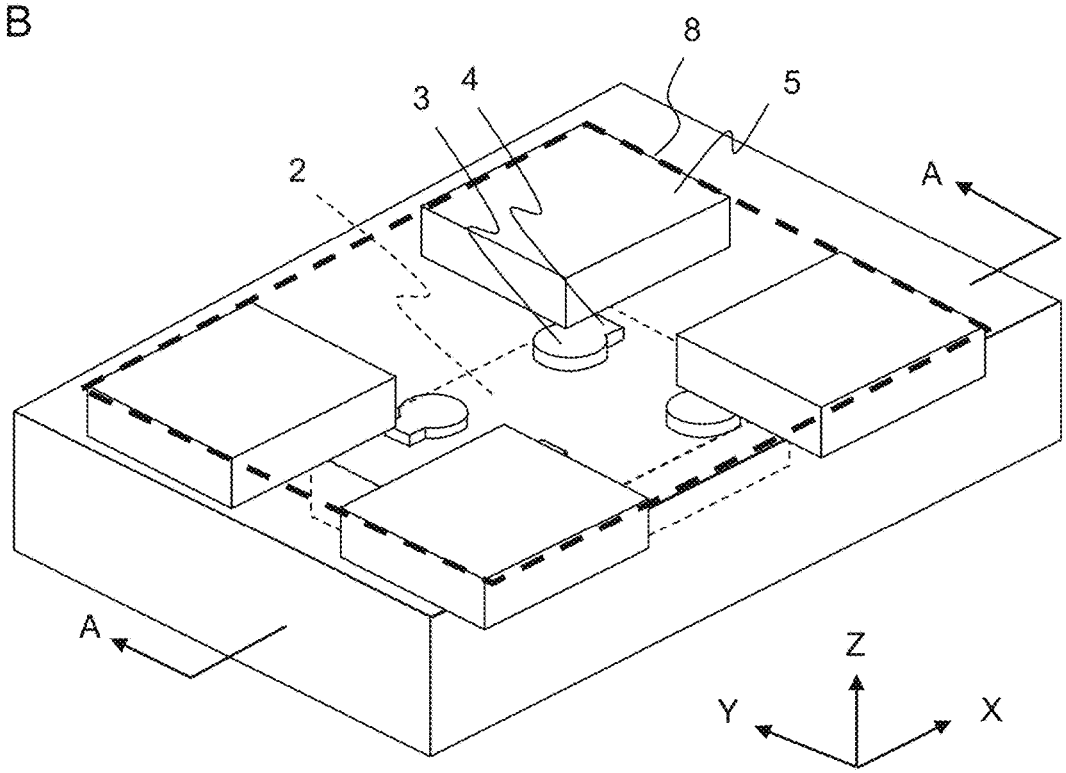

FIGS. 1A and 1B show perspective views of sensor package 1. FIG. 1A is a perspective view illustrating the external shape of sensor package 1, and FIG. 1B shows a perspective view in which filler containing resin 6 in FIG. 1A is omitted. Sensor package 1 includes sensor unit 2 that houses a sensor element (not illustrated), extraction electrodes 3 that are provided on a surface (first surface 21) of sensor unit 2, redistribution layers (conductive layers) 4 that are connected to extraction electrodes 3, respectively, and external connection terminals 5 that are connected to redistribution layers 4, respectively. Sensor unit 2 houses a magnetic sensor using a TMR element, but the type of the sensor is not limited to this. For example, a Hall element or a magnetoresistive element, such as an AMR element and a GMR element, may be used for the sensor. In the present embodiment, four extraction electrodes 3, four redistribution layers 4 and four external connection terminals 5 are provided, but the number is not limited to this. Minimum rectangle 8 that envelops four external connection terminals 5 also envelops sensor unit 2, as seen in Z direction. In other words, sensor unit 2 is located inside minimum rectangle 8 that envelops four external connection terminals 5, as seen in the Z direction.

Sensor unit 2, extraction electrodes 3, redistribution layers 4 and external connection terminals 5 are sealed with filler containing resin 6, except for the upper surface of external connection terminals 5 and bottom surface 22 of sensor unit 2. The resin that forms filler containing resin 6 is epoxy resin, but the type of the resin is not limited to this. Other resins, such as phenol resin and polyimide resin, may also be used. The ratio of the fillers in the resin is not limited and may be selected from the range between 10-90 mass percentage.

Figure 2A:
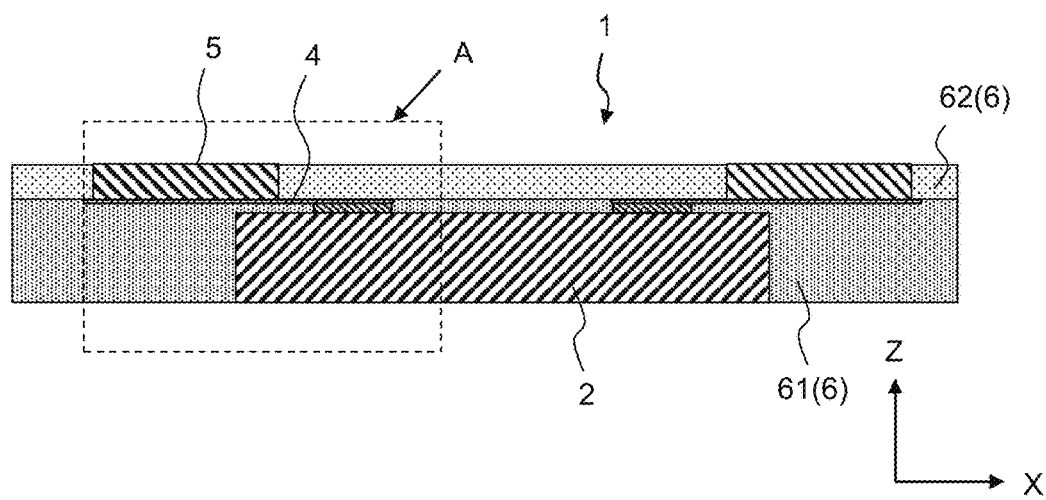
FIGS. 2A and 2B are sectional views of the fan-out package shown in FIGS. 1A and 1B.
Figure 2B:
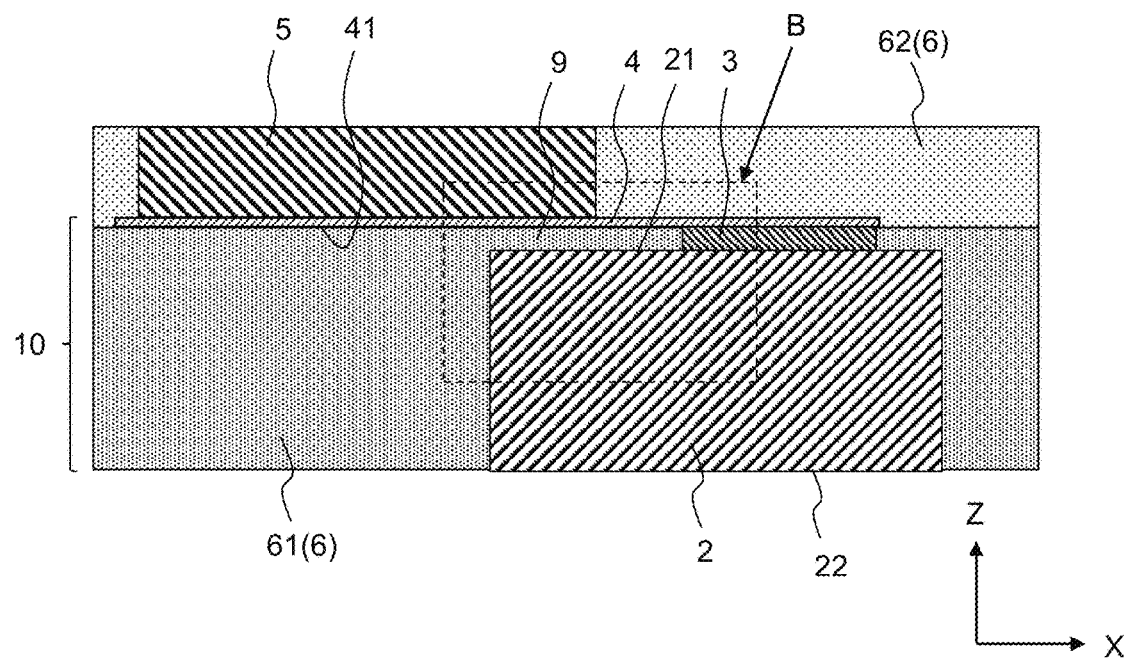

FIG. 2A is a sectional view of sensor package 1 taken along line A-A in FIG. 1B, and FIG. 2B is an enlarged view of portion A in FIG. 2A. Filler containing resin 6 includes first resin layer 61 that covers the sides of sensor unit 2 and the sides of extraction electrodes 3, as well as second resin layer 62 that covers the sides of redistribution layers 4 and the sides of external connection terminals 5. In the present embodiment, first resin layer 61 and second resin layer 62 have the same configuration, including the diameter of the fillers, but may have different configurations. Sensor unit 2 has a generally rectangular parallelepiped shape. Of six surfaces of sensor unit 2, the upper surface that faces redistribution layers 4 forms first surface 21 that is in contact with first resin layer 61. Bottom surface 22, which is the back surface of first surface 21, is exposed. Extraction electrodes 3 that are formed of a conductive metal, such as Cu, are formed on first surface 21.

Redistribution layers 4 are connected to extraction electrodes 3 of sensor unit 2 after sensor unit 2 is formed. Redistribution layers 4 are formed of a conductive metal, such as Cu. Redistribution layers 4 extend substantially parallel to first surface 21 of sensor unit 2 in a direction away from sensor unit 2. The surface of each redistribution layer 4 that faces sensor unit 2 forms second surface 41 that is in contact with first resin layer 61. Thus, gap 9 whose dimension is equal to the space between first surface 21 and second surface 41 is formed between sensor unit 2 and redistribution layers 4, and gap 9 is also filled with first resin layer 61. In other words, sensor unit 2 (the first element), first resin layer 61 and redistribution layers 4 (the second elements) form assembly 10 of stacked elements. External connection terminals 5 are provided on the upper surfaces of respective redistribution layers 4. External connection terminals 5 are formed of a conductive metal, such as Cu, Sn and SnAg, and are electrically connected to redistribution layer 4, respectively.

Figure 3:
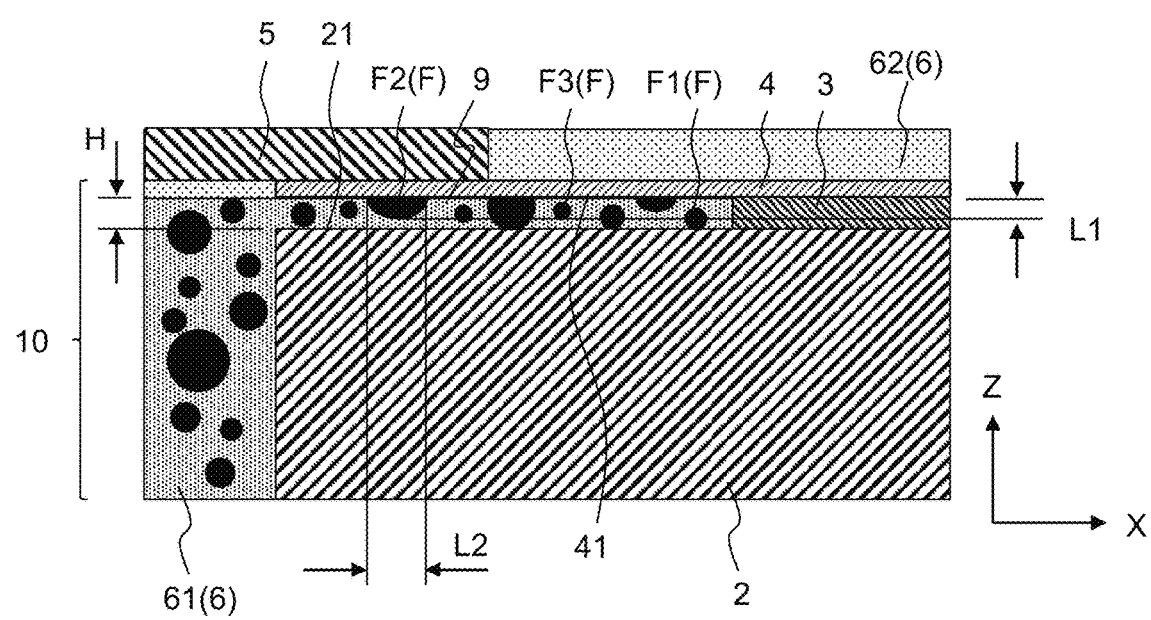
FIG. 3 is an enlarged view of portion B in FIG. 2B.
Figure 4A:
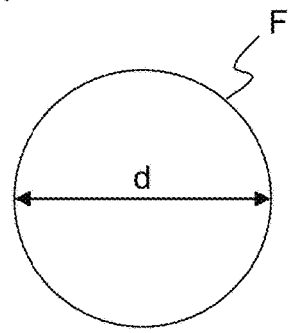
FIGS. 4A-4D are conceptual views illustrating fillers in various shapes before they are ground.
Figure 4B:
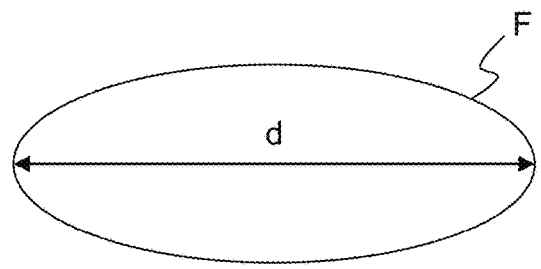
Figure 4C:
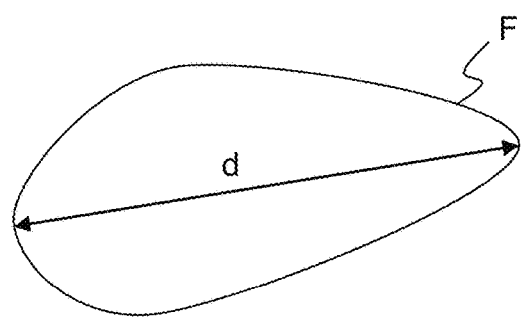
Figure 4D:
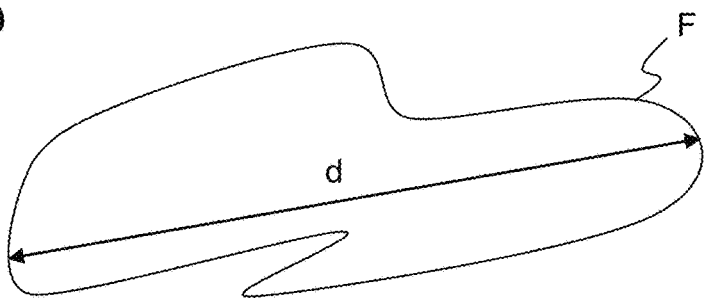

FIG. 3 is an enlarged view of portion B in FIG. 2B illustrating a section that is perpendicular to second surface 41 of redistribution layer 4 (the second element). Fillers F consist of various fillers having different shapes and dimensions. For convenience, only fillers that are spherical before they are ground are shown in FIG. 3, although the shapes of some of the fillers are changed by grinding in the present embodiment, as described later. FIGS. 4A to 4D are sectional views illustrating examples of various shapes of fillers F before the shapes are changed, that is, before the fillers are ground. FIG. 4A shows filler F having a circular section, FIG. 4B shows filler F having a section of ellipse, and FIGS. 4C, 4D show fillers F having sections of irregular shapes. In the present description, the maximum distance between two arbitrary points on the surface of filler F measured on a straight line is defined as the diameter of filler F. In other words, the diameter of filler F refers to the diameter of the sphere having the smallest volume from among spheres that envelop filler F. For example, the diameter of spherical filler F is equal to the diameter of the sphere, and the diameter of ellipse-shaped filler F is equal to the length of the major axis of the ellipse. For convenience, the diameter of the filler is shown as "d" in FIGS. 4A-4D. Thus, a plurality of fillers F consists of fillers F having different filler diameters. The maximum diameter of the fillers depends on the types of fillers available on the market.

Some of fillers F are in contact with first surface 21 (these fillers F are referred to as first fillers F1), some of the other fillers F are in contact with second surface 41 (these fillers F are referred to as second fillers F2), and the remaining fillers F are neither in contact with first surface 21 nor in contact with second surface 41 (these fillers F are referred to as third fillers F3). In the present embodiment, in a section perpendicular to second surface 41, the ratio of maximum length L2 of each filler F in a direction parallel to second surface 41 to maximum thickness L1 of the same filler F in Z direction is defined as the flattening ratio. The average flattening ratio of second fillers F2 is larger than the average flattening ratio of first fillers F1 and third fillers F3, that is, the average flattening ratio of fillers F that are not in contact with second surface 41. In other words, second fillers F2 are more elongate in a direction parallel to second surface 41 than fillers F that are not in contact with second surface 41 on average. As described above, there are numerous numbers of directions that are parallel to second surface 41, and the directions parallel to second surface 41 are not limited to X direction shown in the figure. However, since fillers F are randomly oriented, the average flattening ratio can be determined without major error by using any available section. In addition, fine fillers having small diameters (for example, diameter of less than 1 μm) may be excluded in determining the average flattening ratio. The shape of filler F will be described later in more details.

Figure 5A:
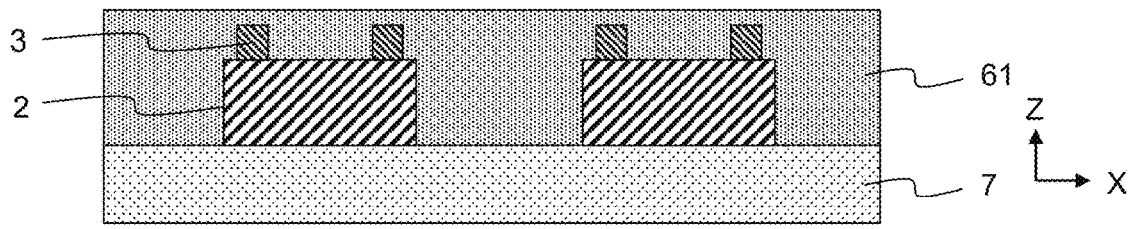
FIGS. 5A-5E are views illustrating the steps of a method of manufacturing the sensor package.

Next, referring to FIGS. 5A-5E, a method of manufacturing sensor package 1 according to the present embodiment will be described. First, as shown in FIG. 5A, a plurality of sensor units 2 is formed on support structure 7 (first element forming step). Sensor units 2 may be formed on a silicon substrate in the wafer process. Alternatively, sensor units 2 that are formed in the wafer process may be separated first, and may be then bonded to a supporting tape by an adhesive. In the present invention, support structure 7 includes both a supporting substrate and a supporting tape. The interval between adjacent sensor units 2 is determined such that external connection terminals 5 of adjacent sensor units 2 (formed in a subsequent step) do not interfere each other. Four extraction electrodes 3 are formed on the upper surface of sensor unit 2. Next, sensor units 2 are covered with first resin layer 61. Thus, first resin layer 61 that contains a plurality of fillers F is formed on the first element (first resin layer forming step). First resin layer 61 may be formed by compression or printing. First resin layer 61 covers not only sensor unit 2 but also extraction electrodes 3. Thereafter, first resin layer 61 is cured. The maximum thickness of at least one second filler F2 that is contained in first resin layer 61, measured in Z direction, or the maximum diameter of the fillers, is larger than dimension H of gap 9 between sensor unit 2 (the first element) and redistribution layer 4 (the second element), which will be formed in a subsequent step. Thus, when dimension H of gap 9 is, for example, about 30 μm, the maximum diameter of the fillers may be, for example, equal to or more than 50 μm.

Figure 5B:
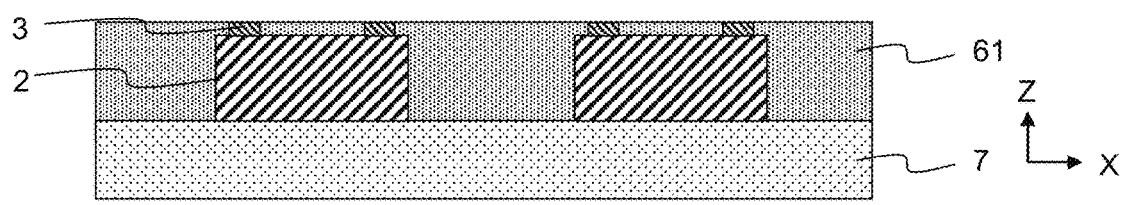

Next, as shown in FIG. 5B, the upper surface of first resin layer 61 that has cured is ground (grinding step). The grinding step may be carried out, for example, by mechanical grinding, by CMP (Chemical Mechanical Polishing) or by a combination of mechanical grinding and CMP. First resin layer 61 and extraction electrodes 3 are ground until extraction electrodes 3 are exposed and the thickness of extraction electrodes 3 is reduced to less than the maximum thickness of second filler F2. Thus, some of second fillers F2 that are contained between the upper surface of first resin layer 61 that is present before the grinding step and the upper surface of first resin layer 61 that is present after the grinding step are entirely or partially removed. Most of second fillers F2 that are exposed on the upper surface of first resin layer 61 after the grinding step are made flat on the upper surface.

Figure 6A:
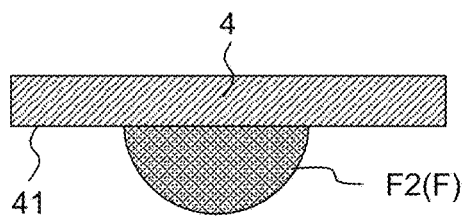
FIGS. 6A-6E are conceptual views illustrating fillers in various shapes after they are ground.
Figure 6B:
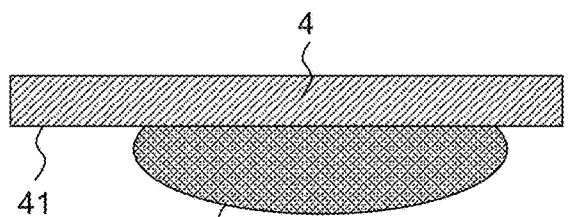
Figure 6C:
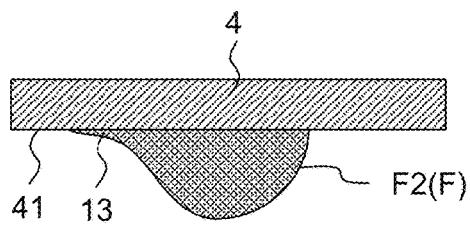
Figure 6D:
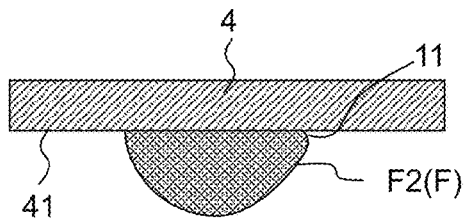
Figure 6E:
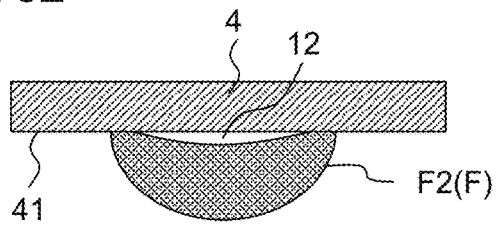

FIGS. 6A-6E conceptually show various shapes of second fillers F2 after grinding. The resin that has been cured is not largely deformed by grinding. Fillers F stay substantially at the same positions, and the upper portions of fillers F are removed and made flat by grinding. If the original shape of filler F is, for example, spherical, then filler F is deformed into a sphere with the upper portion removed, as shown in FIG. 6A. If the original shape of filler F is, for example, an ellipse, then filler F is deformed into an ellipse with the upper portion removed, as shown in FIG. 6B. Some of fillers F are in surface contact with second surface 41, as shown, for example, in FIGS. 6A-6E. Some of fillers F have the maximum length on second surface 41 in a direction parallel to second surface 41, as shown, for example, in FIGS. 6A, 6C and 6E. Some of fillers F extend flatly along second surface 41, as shown, for example, in FIGS. 6A-6D. Some of fillers F have whisker 13 that extends on second surface 41 at the end of the filler that is in contact with second surface 41, as shown, for example, in FIG. 6C. Whisker 13 is considered to be generated by a grinding pad pulling filler F during the mechanical grinding. Some of fillers F have notch 11 at the end of the fillers, as shown, for example, in FIG. 6D. Notch 11 is considered to be generated by a grinding pad pushing filler F during the mechanical grinding. Some of fillers F form cavity 12 between the fillers and second surface 41, as shown, for example, in FIG. 6E. Cavity 12 is considered to be generated by a grinding pad pushing both ends of filler F during the mechanical grinding. As described above, fillers F have various shapes, but the shapes shown FIGS. 6A-6E are not ones that the fillers normally have, and these shapes are considered to be generated by grinding.

Figure 5C:
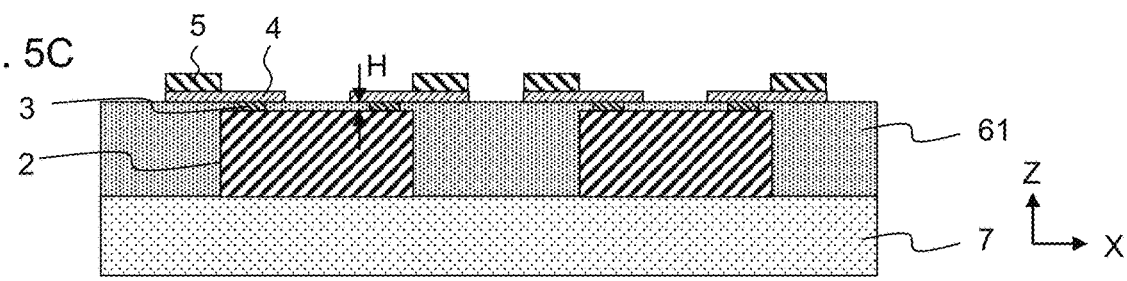
Figure 5D:
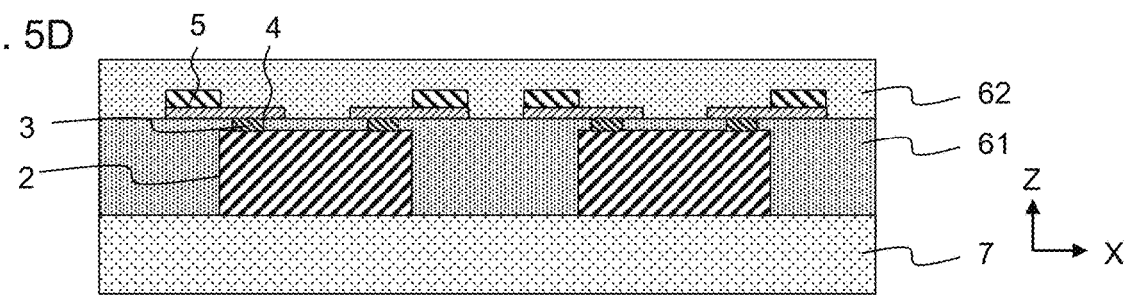
Figure 5E:
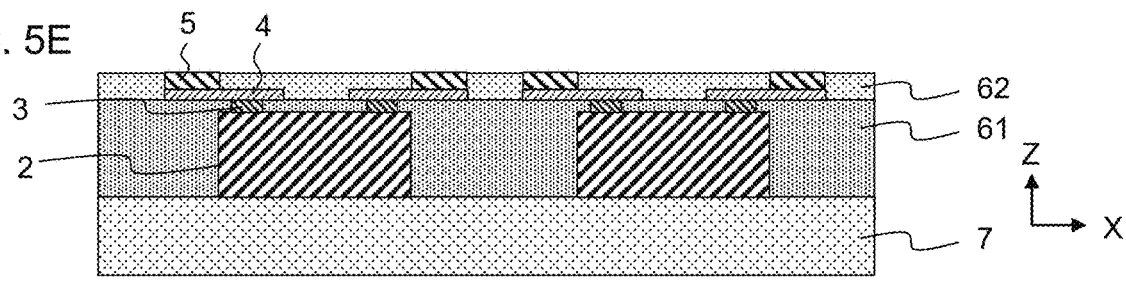

Next, as shown in FIG. 5C, redistribution layers 4 (the second elements) are formed on the upper surface of first resin layer 61 that has been ground (second element forming step). The lower surfaces of redistribution layers 4 (second surface 41) are in contact with the upper surface of first resin layer 61 that has been ground. Redistribution layers 4 are connected to extraction electrodes 3. Redistribution layers 4 are formed, for example, by plating, sputtering, printing and coating. Next, external connection terminals 5 are formed on redistribution layers 4. External connection terminals 5 are formed, for example, by plating, sputtering, printing and coating. Next, as shown in FIG. 5D, redistribution layers 4 and external connection terminals 5 are sealed with second resin layer 62. A filler containing resin may be used as second resin layer 62, like first resin layer 61. Next, as shown in FIG. 5E, second resin layer 62 is ground until external connection terminals 5 are exposed. Thereafter, each sensor package 1 is separated, and support structure 7 is removed. Support structure 7 is removed in the present embodiment, but may be used as part of the product.

Figure 7:
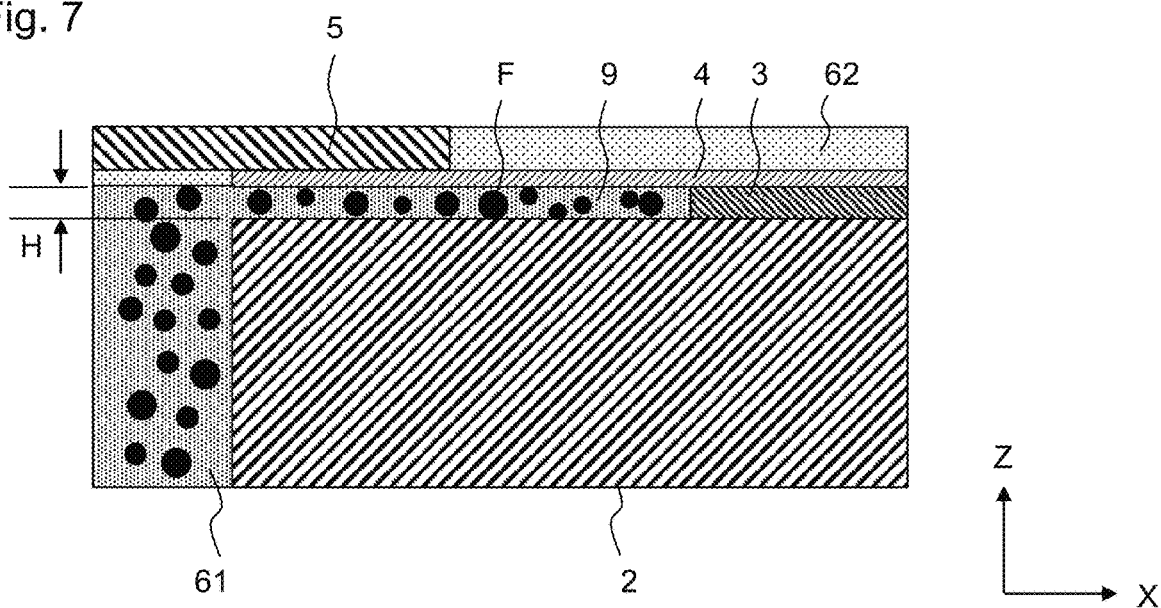
FIG. 7 is a partial sectional view of a comparative example showing the same portion as FIG. 3.

FIG. 7 is a sectional view of a conventional sensor package showing the same portion as FIG. 3. The maximum filler diameter of first resin layer 61 is smaller than the maximum filler diameter of first resin layer 61 of the present embodiment. The diameters of fillers F that are present between sensor unit 2 and redistribution layers 4 are smaller than dimension H of gap 9, and fillers F are substantially spherical. However, fillers having a small maximum diameter are costlier than fillers having a large maximum diameter. In the present embodiment, the cost of sealing resin can be reduced because fillers having a large maximum diameter can be used.

In addition, in the present embodiment, first resin layer 61 is characterized by good heat dissipation capability. First resin layer 61 requires good thermal conductivity in order to dissipate heat that is generated in sensor unit 2. The thermal conductivity of first resin layer 61 largely depends on the thermal conductivity of the fillers because, in general, the thermal conductivity of resin is low and the thermal conductivity of fillers is high. For example, the thermal conductivity of $SiO_2$, which is an example of the material of the filler, is about 8 $Wm^{-1}K^{-1}$, while the thermal conductivity of epoxy resin is as small as about 0.21 $Wm^{-1}K^{-1}$. In the present embodiment, due to the fillers having a large maximum diameter, a large contact area between fillers F and redistribution layers 4 (to be more precise, contact area between redistribution layers 4 and filler F per unit area of redistribution layer 4) can be easily ensured. This enhances heat conductivity from redistribution layers 4 to fillers F. In addition, the number of boundaries between fillers F and the resin decreases in first resin layer 61. Thus, heat that is generated in sensor unit 2 is easily transferred to redistribution layers 4 via a limited number of fillers F so that heat transfer paths can be easily ensured in first resin layer 61. In other words, heat transfer paths are less likely to be cut by the resin and heat that is generated in sensor unit 2 can be more efficiently transferred to redistribution layers 4. It should be noted that the thermal conductivity of resin layer 6 is improved as a whole in the present embodiment because fillers F having a large maximum diameter are also used in portions other than gap 9.

In addition, since fillers having small diameters easily move while they are ground, small unevenness tends to occur on the surface that has been ground, and the small unevenness may lead to cavities between first resin layer 61 and redistribution layers 4. In the present embodiment, due to the use of fillers having a large maximum diameter, the number of fillers of small diameters relatively decreases, and the surface of first resin layer 61 that has been ground tends to be made flat.

Figure 8:
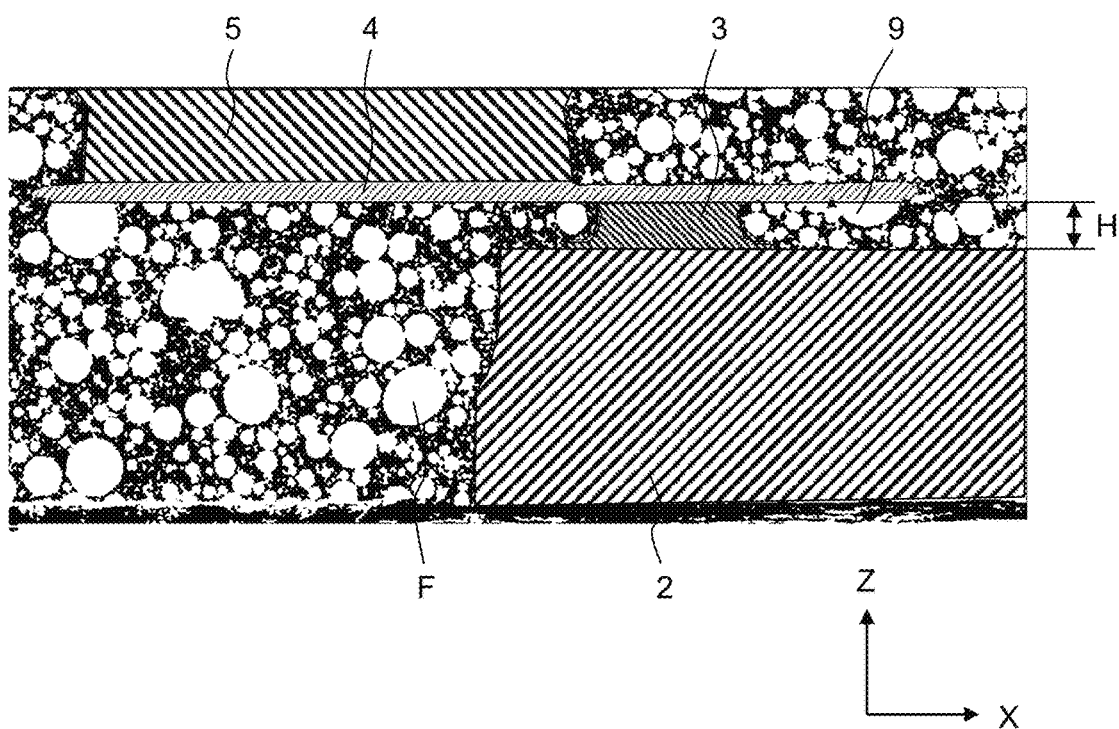
FIG. 8 is a photograph of an example showing the same portion as FIG. 3.

FIG. 8 is a photograph of sensor package 1 that has been manufactured according to the present embodiment, showing the same portion as FIG. 3 (for convenience, elements other than the resin layer are conceptually illustrated). In the figure, the black parts show epoxy resin and the white parts show fillers F. Dimension H of the gap is 18 μm, and the maximum diameter of the fillers is 25 μm. As described above, first resin layer 61 contains various kinds of fillers F that are different in shape and dimension. It is confirmed from FIG. 8 that fillers F that are in contact with redistribution layers 4 in gap 9 between sensor unit 2 and redistribution layers 4 have been made flat by mechanical grinding.

Although certain preferred embodiments of the present invention have been shown and described in detail, it should be understood that various changes and modifications may be made without departing from the spirit or scope of the appended claims.

LIST OF REFERENCE NUMERALS 1 sensor package
2 first element (sensor unit)
21 first surface
3 extraction electrode
4 second element (redistribution layer)
41 second surface
5 external connection terminal
6 resin layer
61 first resin layer
10 assembly of stacked elements
F filler
F1 first filler
F2 second filler
F3 third filler

What is claimed is:

1. A method of manufacturing an assembly of stacked elements comprising:
    forming a first element having a first surface;
    forming a resin layer on the first surface, wherein the resin layer contains a plurality of fillers;
    grinding an upper surface of the resin layer; and
    forming a second element on the upper surface of the resin layer that has been ground, wherein the second element has a second surface that is in contact with the upper surface,
    wherein
    at least one filler of the plurality of fillers is in direct contact with both the first surface and the second surface,
    a filler of the plurality of fillers that is exposed on the upper surface of the resin layer after grinding of the resin layer is made flat on the upper surface, and
    the first surface and the second surface are parallel to each other.

2. The method according to claim 1, wherein some fillers of the plurality of fillers that are contained between the upper surface of the resin layer that is present before grinding of the resin layer and the upper surface of the resin layer that is present after the grinding of the resin layer are entirely or partially removed in the grinding of the resin layer.

3. The method according to claim 1, wherein grinding of the resin layer is carried out by mechanical grinding.

4. The method according to claim 1, wherein a maximum diameter of the plurality of fillers is equal to or more than 50 μm, wherein the diameter refers to a diameter of a sphere having a smallest volume from among spheres that envelop the filler.

5. A method of manufacturing a sensor package comprising the method according to claim 1, wherein
    in forming of the first element, a sensor unit is formed as the first element, wherein the sensor unit has an extraction electrode formed on an upper surface thereof;
    in forming of the resin layer, the sensor unit and the extraction electrode are sealed with the resin layer;
    in grinding of the resin layer, the resin layer and the extraction electrode are ground until a thickness of the extraction electrode is reduced to less than a maximum thickness of at least one filler of the plurality of fillers;
    in forming of the second element, a conductive layer is formed as the second element, wherein the conductive layer is connected to the extraction electrode; and
    after the forming of the second element, an external connection terminal is formed on the conductive layer.

6. A method of manufacturing an assembly of stacked elements comprising:
    forming a first element having a first surface;
    forming a resin layer on the first surface, wherein the resin layer contains a plurality of fillers;
    grinding an upper surface of the resin layer; and
    forming a second element on the upper surface of the resin layer that has been ground, wherein the second element has a second surface that is in contact with the upper surface,
    wherein
    the resin layer is also arranged on a side of the first element, the side of the first element being a surface of the first element different from the first surface, and a thickness of the resin layer on the side of the first element is larger than a gap between the first surface and the second surface, wherein a largest diameter of at least one filler of the plurality of fillers of the resin layer that is located on the side of the first element is larger than the gap, wherein the diameter refers to a diameter of a sphere having a smallest volume from among spheres that envelop the filler,
    a filler of the plurality of fillers that is exposed on the upper surface of the resin layer after grinding of the resin layer is made flat on the upper surface, and
    the first surface and the second surface are parallel to each other.

7. The method according to claim 6, wherein some fillers of the plurality of fillers that are contained between the upper surface of the resin layer that is present before grinding of the resin layer and the upper surface of the resin layer that is present after the grinding of the resin layer are entirely or partially removed in the grinding of the resin layer.

8. The method according to claim 6, wherein grinding of the resin layer is carried out by mechanical grinding.

9. The method according to claim 6, wherein the maximum diameter of the plurality of fillers is equal to or more than 50 µm.

10. A method of manufacturing a sensor package comprising the method according to claim 6, wherein
in forming of the first element, a sensor unit is formed as the first element, wherein the sensor unit has an extraction electrode formed on an upper surface thereof;
in forming of the resin layer, the sensor unit and the extraction electrode are sealed with the resin layer;
in grinding of the resin layer, the resin layer and the extraction electrode are ground until a thickness of the extraction electrode is reduced to less than a maximum thickness of at least one filler of the plurality of fillers that is located between the first surface and the second surface;
in forming of the second element, a conductive layer is formed as the second element, wherein the conductive layer is connected to the extraction electrode; and
after the forming of the second element, an external connection terminal is formed on the conductive layer.

11. A method of manufacturing an assembly of stacked elements comprising:
forming a first element having a first surface;
forming a resin layer on the first surface, wherein the resin layer contains a plurality of fillers;
grinding an upper surface of the resin layer; and
forming a second element on the upper surface of the resin layer that has been ground, wherein the second element has a second surface that is in contact with the upper surface,
wherein
a diameter of at least one filler of the plurality of fillers that are contained in the resin layer before the upper surface of the resin layer is ground is larger than a gap between the first surface and the second surface after the second surface is formed, wherein the diameter refers to a diameter of a sphere having a smallest volume from among spheres that envelop the filler,
a filler of the plurality of fillers that is exposed on the upper surface of the resin layer after grinding of the resin layer is made flat on the upper surface, and
the first surface and the second surface are parallel to each other.

12. The method according to claim 11, wherein some fillers of the plurality of fillers that are contained between the upper surface of the resin layer that is present before grinding of the resin layer and the upper surface of the resin layer that is present after grinding of the resin layer are entirely or partially removed in the grinding of the resin layer.

13. The method according to claim 11, wherein grinding of the resin layer is carried out by mechanical grinding.

14. The method according to claim 11, wherein the maximum diameter of the plurality of fillers is equal to or more than 50 µm.

15. A method of manufacturing a sensor package comprising the method according to claim 11, wherein
in forming of the first element, a sensor unit is formed as the first element, wherein the sensor unit has an extraction electrode formed on an upper surface thereof;
in forming of the resin layer, the sensor unit and the extraction electrode are sealed with the resin layer;
in grinding of the resin layer, the resin layer and the extraction electrode are ground until a thickness of the extraction electrode is reduced to less than a maximum thickness of at least one filler of the plurality of fillers;
in forming of the second element, a conductive layer is formed as the second element, wherein the conductive layer is connected to the extraction electrode; and
after the forming of the second element, an external connection terminal is formed on the conductive layer.

16. The method according to claim 11, wherein at least one filler of the plurality of fillers is in contact with the second surface and is opposite to the first surface with only resin interposed between the at least one of the fillers and the first surface in cross-section.

17. The method according to claim 16, wherein in a section that is between the at least one filler of the plurality of fillers and the first surface and in a region of a total length of the at least one filler of the plurality of fillers in a direction parallel to the second surface, only the resin is interposed between the at least one filler of the plurality of fillers and the first surface.

18. A method of manufacturing an assembly of stacked elements comprising:
forming a first element having a first surface;
forming a resin layer on the first surface, wherein the resin layer contains a plurality of fillers;
grinding an upper surface of the resin layer; and
forming a second element on the upper surface of the resin layer that has been ground, wherein
the second element has a second surface that is in contact with the upper surface,
the resin layer is also arranged on a side of the first element, the side of the first element being a surface of the first element different from the first surface, and a thickness of the resin layer on the side of the first element is larger than a gap between the first surface and the second surface,
at least one filler of the plurality of fillers is in direct contact with both the first surface and the second surface, and a diameter of at least one filler of the plurality of fillers that are contained in the resin layer before the upper surface of the resin layer is ground is larger than the gap between the first surface and the second surface after the second surface is formed,
a filler of the plurality of fillers that is exposed on the upper surface of the resin layer after grinding of the resin layer is made flat on the upper surface,
a largest diameter of at least one filler of the plurality of fillers in the resin layer that is located on the side of the first element is larger than the gap, p1 the first surface and the second surface are parallel to each other, and
the diameter refers to a diameter of a sphere having a smallest volume from among spheres that envelop the filler.

* * * * *